United States Patent
Ahlf et al.

(10) Patent No.: US 11,286,561 B2
(45) Date of Patent: *Mar. 29, 2022

(54) PROCESS FOR PRODUCING FLEXIBLE ORGANIC-INORGANIC LAMINATES

(71) Applicant: BASF Coatings GMBH, Münster (DE)

(72) Inventors: Maraike Ahlf, Schriesheim (DE); Juergen Frank, Ludwigshafen (DE); Torben Adermann, Heidelberg (DE); Stephan Klotz, Dornach (CH)

(73) Assignee: BASF Coatings GMBH, Münster (DE)

( * ) Notice: Subject to any disclaimer, the term of this patent is extended or adjusted under 35 U.S.C. 154(b) by 190 days.

This patent is subject to a terminal disclaimer.

(21) Appl. No.: 15/559,497

(22) PCT Filed: Mar. 15, 2016

(86) PCT No.: PCT/EP2016/055534
§ 371 (c)(1),
(2) Date: Sep. 19, 2017

(87) PCT Pub. No.: WO2016/150759
PCT Pub. Date: Sep. 29, 2016

(65) Prior Publication Data
US 2018/0119279 A1   May 3, 2018

(30) Foreign Application Priority Data

Mar. 25, 2015   (EP) ..................................... 15160789

(51) Int. Cl.
*C23C 16/455*  (2006.01)
*C23C 16/30*   (2006.01)

(52) U.S. Cl.
CPC ........ *C23C 16/45529* (2013.01); *C23C 16/30* (2013.01); *C23C 16/45555* (2013.01)

(58) Field of Classification Search
CPC .............. C23C 28/42; C23C 16/45529; H01L 51/5256; C08J 7/0423; B32B 2250/42
(Continued)

(56) References Cited

U.S. PATENT DOCUMENTS 5,275,853 A * 1/1994 Silvis .................... C08G 59/64
                                                428/35.4
5,736,207 A * 4/1998 Walther ............... B65D 1/0215
                                                428/34.7
(Continued)

FOREIGN PATENT DOCUMENTS

KR     20140045716 A    4/2014
WO     2011099858 A1    8/2011
(Continued)

OTHER PUBLICATIONS

Oxidation of Amines retrieved from https://chem.libretexts.org/Bookshelves/Organic_Chemistry/Book%3A_Basic_Principles_of_Organic_Chemistry_(Roberts_and_Caserio)/23%3A_Organonitrogen_Compounds_I%3A_Amines/23.11%3A_Oxidation_of_Amines (Year: 2019).*

(Continued)

*Primary Examiner* — Maria V Ewald
*Assistant Examiner* — Daniel P Dillon
(74) *Attorney, Agent, or Firm* — Armstrong Teasdale LLP

(57) ABSTRACT

Processes for producing flexible organic-inorganic laminates are described herein. In particular, a process is provided for producing a laminate comprising at least twice a sequence comprising (a) depositing an inorganic layer by performing 3 to 150 cycles of an atomic layer deposition process, and (b) depositing an organic layer comprising nitrogen by performing 1 to 3 cycles of a molecular layer deposition process.

15 Claims, 2 Drawing Sheets

(58) Field of Classification Search
USPC .......................................................... 428/216
See application file for complete search history.

(56) References Cited

U.S. PATENT DOCUMENTS

| | | | | |
|---|---|---|---|---|
| 9,576,876 | B2* | 2/2017 | Sung | H01L 51/0034 |
| 2003/0143319 | A1* | 7/2003 | Park | C23C 16/45525 |
| | | | | 427/64 |
| 2009/0169904 | A1* | 7/2009 | Yamada | C08J 7/0423 |
| | | | | 428/458 |
| 2009/0233101 | A1* | 9/2009 | Tsukamoto | C08J 7/043 |
| | | | | 428/419 |
| 2010/0178481 | A1* | 7/2010 | George | C23C 16/402 |
| | | | | 428/213 |
| 2011/0171439 | A1* | 7/2011 | Jahromi | B32B 27/36 |
| | | | | 428/209 |
| 2012/0121932 | A1 | 5/2012 | George et al. | |
| 2017/0121817 | A1 | 5/2017 | Ahlf et al. | |

FOREIGN PATENT DOCUMENTS

| | | | | |
|---|---|---|---|---|
| WO | WO-2015030297 | A1 * | 3/2015 | H01L 21/563 |
| WO | 2015188992 | A1 | 12/2015 | |
| WO | 2016116245 | A1 | 7/2016 | |

OTHER PUBLICATIONS

Paetzold, et al., "Permeation Rate Measurements by Electrical Analysis of Calcium Corrosion", Review of Scientific Instruments, vol. 74, Issue 12, 2003, pp. 5147-5150.

Steven M. George, "Atomic Layer Deposition: An Overview", Chemical Reviews, vol. 110, Issue 1, 2010, pp. 111-131.

International Search Report and Written Opinion for International Application No. PCT/EP2016/055534 dated May 20, 2016, 8 pages.

Seghete et al. "Synthesis and characterization of hybrid organic-inorganic thin films via atomic layer deposition for MEMS/NEMS" dated Sep. 30, 2008, 5 pages [[ https://www.researchgate.net/publication/237636920 ]].

George, et al.,"Surface Chemistry for Molecular Layer Deposition of Organic and Hybrid Organic-Inorganic Polymers", Accounts of Chemical Research, vol. 42, Issue 4, 2009, pp. 498-508.

Zhou, et al., "Charge trapping behavior in organic-inorganic alloy films grown by molecular layer deposition from trimethylaluminum, p-phenylenediamine and water", Journal of Materials Chemistry,, vol. 22, 2012, pp. 23935-23943.

* cited by examiner

PROCESS FOR PRODUCING FLEXIBLE ORGANIC-INORGANIC LAMINATES

CROSS-REFERENCE TO RELATED APPLICATIONS

This application is a U.S. National Phase Application of PCT/EP2016/055534, filed Mar. 15, 2016, which claims the benefit of priority to EP Application No. 15160789.2, filed Mar. 25, 2015, the contents of which are hereby expressly incorporated by reference in their entirety.

The present invention is in the field of processes for producing flexible organic-inorganic laminates as well as barrier films comprising flexible organic-inorganic laminates by atomic layer deposition.

Electronic devices need efficient encapsulation and passivation due to their high sensitivity to moisture and oxygen. Typically, inorganic materials such as oxides, nitrides, carbides or glass are used as barrier material as they show excellent moisture and oxygen barrier properties. However, inorganic materials strongly limit the form factor of electronic devices due to their rigidity. Furthermore, the fragility of e.g. large glass sheets makes production processes difficult and expensive. Electronic devices containing materials such as glass are prone to breakage upon mechanical stress.

US 2010/0 178 481 A1 discloses a barrier layer consisting of two inorganic non-silica layers in between which one flexibilizing layer is present. However, such a barrier layer shows unsatisfactory barrier properties after bending, particularly after bending around small radii.

It was an objective of the present invention to provide a process for producing films with high water and oxygen barrier properties. At the same time it was aimed at providing a process for producing films which retain their barrier properties under high mechanical stress such as bending. A further objective was to provide a process for producing films with high stability against degradation in a humid atmosphere at elevated temperatures.

The objectives were achieved by a process for producing a laminate comprising at least twice a sequence comprising
(a) depositing an inorganic layer by performing 3 to 150 cycles of an atomic layer deposition process, and
(b) depositing an organic layer comprising nitrogen by performing 1 to 3 cycles of a molecular layer deposition process.

The present invention further relates to a laminate comprising at least twice a layer sequence comprising
(a) an inorganic layer having a thickness of 0.3 to 15 nm and
(b) a nitrogen-comprising organic layer having a thickness of 0.1 to 3 nm.

The present invention further relates to a barrier film comprising the laminate according to the present invention.

The present invention further relates to the use of the barrier film according to the present invention for encapsulation, packaging, or passivation.

The present invention further relates to an electronic device comprising the barrier film according to the present invention.

Preferred embodiments of the present invention can be found in the description and the claims.

Combinations of different embodiments fall within the scope of the current invention.

A laminate in the context of the present invention is a product in which at least two layers of a different chemical composition are in close contact to each other. Unless indicated otherwise, there is generally no particular restriction to the size, the composition of each layer, or the strength with which the layers are held together. A layer is as usually used in the field of atomic layer deposition a flat structure of variable thickness ranging from the dimension of a single atom to macroscopic thicknesses.

Inorganic in the context of the present invention refers to materials which contain at least 1 wt.-% of at least one metal or semimetal, preferably at least 2 wt.-%, more preferably at least 5 wt.-%, in particular at least 10 wt.-%. Organic in the context of the present invention refers to materials which contain more than 99 wt.-% of nonmetals, preferably more than 99.5 wt.-%, in particular completely or essentially completely. It is even more preferable that the nonmetals are C, H, O, N, S, Se and/or P.

Atomic layer deposition (ALD) is a technique in which a series of self-limiting surface reactions are conducted which builds up conformal coatings of precise thickness depending on the number of self-limiting reactions performed. Typically the surface reaction takes place upon adsorption of a precursor from the gaseous state to the substrate. When all accessible surface sites of the substrate are occupied, no further precursor adsorbs to the substrate making the reaction self-limiting. After removal of excess precursor the deposited layer is treated either chemically or physically which allows the subsequent deposition of further precursor. A sequence comprising such deposition and treatment is usually referred to as a cycle in the ALD process. The ALD process is described in detail by George (Chemical Reviews 110 (2010), 111-131). If organic molecules are deposited in an ALD process, such a process is often referred to as molecular layer deposition process (MLD).

The process according to the present invention comprises depositing an inorganic layer by performing 3 to 150 cycles of an atomic layer deposition process. Preferably the process comprises at least 4 cycles, more preferably at least 5 cycles, in particular at least 6 cycles. Preferably the process comprises not more than 50 cycles, more preferably not more than 40 cycles, in particular not more than 30 cycles, such as not more than 20 cycles.

A cycle in an ALD process to form an inorganic layer typically comprises bringing a metal- or semimetal-containing compound or mixtures thereof into the gaseous state and depositing it from the gaseous state onto a substrate. In the following the term "metal or semimetal" is abbreviated by "(semi)metal". Bringing the (semi)metal-containing compound to the gaseous state can be achieved by heating it to elevated temperatures. In any case a temperature below the decomposition temperature of the (semi)metal-containing compound has to be chosen. Preferably, the heating temperature ranges from slightly above room temperature to 300° C., more preferably from 30° C. to 250° C., even more preferably from 40° C. to 200° C., in particular from 50° C. to 150° C. Alternatively or additionally, an inert gas such as nitrogen or argon can be purged through the (semi)metal-containing compound. In this way the inert gas is saturated with (semi)metal-containing compound in the gaseous state corresponding to the vapor pressure of the (semi)metal-containing compound.

Metals in the metal-containing compound are Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Semimetals in the semimetal-containing compound are B, Si, As, Ge, Sb. Preferred (semi)metals are B, Al, Si, Ti, Zn, Y, Zr, La, in particular Al.

Any (semi)metal-containing compound which can be brought into the gaseous state and which can react with a surface is suitable. Preferably, the (semi)metal-containing compound is a (semi)metal organic compound. These compounds include alkyl (semi)metals such as dimethyl zinc, trimethylaluminum or dibutyl tin; (semi)metal alkoxylates such as tetramethoxy silicon or tetra-isopropoxy zirconium; cyclopentadiene adducts like ferrocene or titanocene; (semi)metal carbenes such as tantalum-pentaneopentylat or bisimidazolidinylenrutheniumchloride; (semi)metal halogenides such as germanium tetrabromide or titanium tetrachloride; carbon monoxide complexes like chromium hexacarbonyl or nickel tetracarbonyl. More preferably, the (semi)metal-containing compound is an alkyl (semi)metal, in particular a $C_1$ to $C_4$ alkyl (semi)metal.

It is possible to use more than one (semi)metal-containing compound. In this way it is possible to produce inorganic layers comprising for example mixed (semi)metal oxides such as tin-zinc oxide or barium-titanium oxides.

Preferably, a second (semi)metal-containing compound is present at 1 to 30 mol-% with respect to the total molar amount of (semi)metal-containing compound, more preferably at 2 to 15 mol-%. In this case, (semi)metal-doped inorganic layers are accessible, for example aluminumdoped zinc oxide, tin-doped indium oxide, or antimony-doped tin oxide. Alternatively, in order to obtain halogen-doped inorganic layers it is possible to use a halogen- and (semi)metal-containing compound or a halogen-containing compound in addition to the (semi)metal-containing compound preferably in an amount of 1 to 30 mol-% with respect to the total molar amount of (semi)metal-containing compound and halogen-containing compound, more preferably of 2 to 15 mol-%. Examples for such halogen-containing compounds are chlorine gas, ammonium fluoride or tin tetrachloride.

A cycle in an ALD process to form an inorganic layer typically further comprises the decomposition of the (semi)metal-containing compound after it is deposited onto a substrate. The decomposition can be effected in various ways. The temperature of the solid substrate can be increased above the decomposition temperature of the (semi)metal-containing compound. Furthermore, it is possible to expose the deposited (semi)metal-containing compound to oxygen, ozone, a plasma like oxygen plasma, ammonia, oxidants like nitrous oxide or hydrogen peroxide, reducing agents like hydrogen, alcohols, hydrazine or hydroxylamine, or solvents like water. It is preferable to use oxidants, plasma or water to obtain a layer of a (semi)metal oxide. Exposure to water, an oxygen plasma or ozone is preferred. Exposure to water is particularly preferred. If layers of elemental (semi)metal are desired it is preferable to use reducing agents. For layers of (semi)metal nitrides it is preferable to use ammonia or hydrazine.

A cycle in an ALD process to form an organic layer typically comprises bringing a nitrogen-containing compound into the gaseous state and depositing it from the gaseous state onto a substrate. The nitrogen in the nitrogen-containing compound is preferably in the oxidation state −3, i.e. the nitrogen-containing compound is preferably an amine. Amines include primary, secondary or tertiary amines, preferably primary or secondary amine, in particular primary amines. Preferably, the nitrogen-containing compound further comprises a second functional group, more preferably a functional group containing acidic hydrogens such as a second amine, a hydroxyl group or a thiol group, preferably a hydroxyl group.

The nitrogen-containing compound can be aliphatic or aromatic, preferably aromatic. More preferably, the nitrogen-containing compound is an aromatic amine, whereby the amine can be either conjugated to the aromatic group or attached to the aromatic group via a linker, for example a methylene group. Aromatic groups include aromatic hydrocarbons such as benzene, naphthalene, biphenyl; or heteroaromatic groups such as pyridine, thiophene, pyrrole, furane. Aromatic hydrocarbons are preferred, in particular benzene.

Some particularly preferred examples for nitrogen-containing compounds are the following:

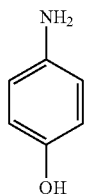

C-1

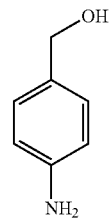

C-2

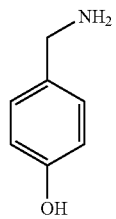

C-3

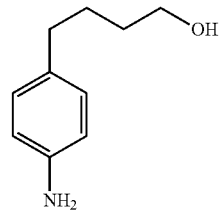

C-4

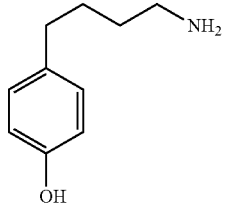

C-5

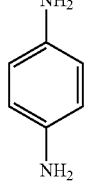

C-6

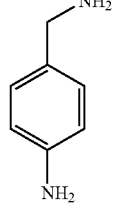

C-7

C-8
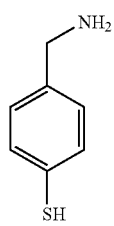
C-9
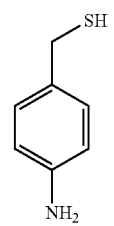
C-10
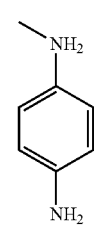
C-11
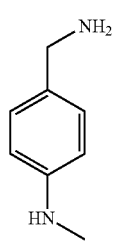
C-12
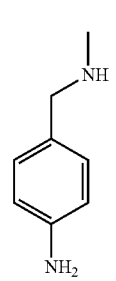
C-13
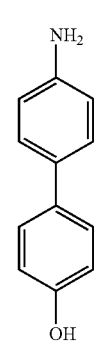
C-14
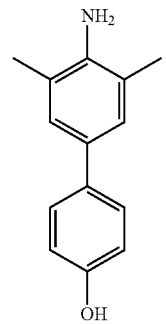
C-15
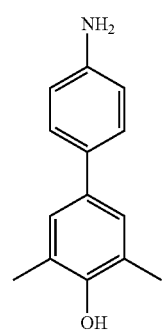
C-16
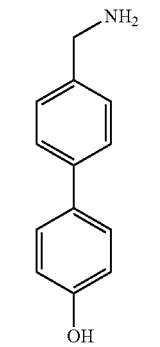
C-17
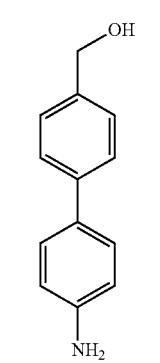

-continued

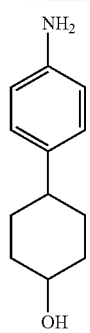
C-18

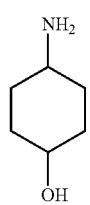
C-19

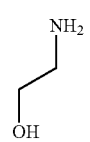
C-20

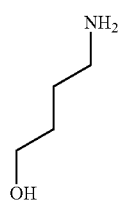
C-21

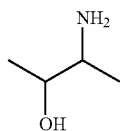
C-22

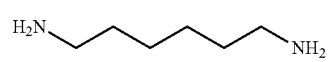
C-23 system, such as benzene, either directly or via a linker such as a methylene group. Some preferred examples for nitrogen-containing compounds containing two nitrogen atoms are given below.

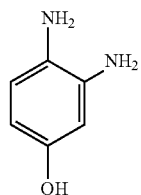
C-24

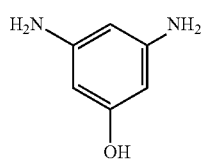
C-25

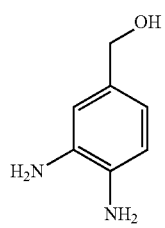
C-26

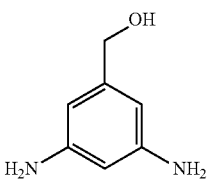
C-27

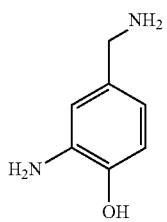
C-28

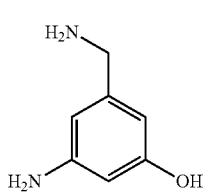
C-29

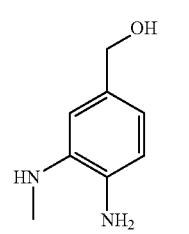
C-30

Particularly preferred are 4-aminophenol (C-1) and 4-aminobenzylic alcohol (C-2). It is also possible to make the organic layer with different organic molecules with the provision that at least one organic molecule is nitrogen-containing.

Preferably, the nitrogen-containing compound contains at least two amine groups, more preferably two amine groups. Even more preferably, the nitrogen-containing compound contains two amine groups and one hydroxyl group. Preferably, the two amino groups are attached to an aromatic

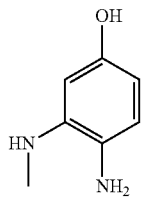

C-31

According to the present invention the organic layer is made by 1 to 3 ALD cycles comprising a nitrogen-containing compound, preferably 1 or 2 ALD cycles, in particular 1 ALD cycle. If more than one ALD cycles comprising a nitrogen-containing compound are performed, it is often necessary to include the deposition of a linker compound in an ALD cycle for making the organic layer. Examples include phosgene, thionyl chloride, diacid dichlorides such as oxalyl chloride or diisocyanates such as ethylenediisocyanate. It is also possible that an inorganic compound can form the linker such as alkyl (semi)metals, for example trimethylaluminum. In this case the organic layer also includes (semi)metals.

The temperature for the ALD process is in the range of −20 to 500° C., preferably 0 to 300° C., in particular 50 to 200° C. Typically, the surface is exposed to the (semi)metal-containing compound or the nitrogen-containing compound in one ALD cycle for 1 ms to 30 s, preferably 10 ms to 5 s, in particular 50 ms to 1 s. It is preferable to purge the substrate with an inert gas in between exposing the surface to the (semi)metal-containing compound or the nitrogen-containing compound of different chemical structure, normally for 0.1 s to 10 min, preferably for 1 s to 3 min, in particular for 10 s to 1 min.

The ALD process can be performed in a wide pressure range such as from 5000 to $10^{-5}$ mbar. When the (semi)metal-containing compound or the nitrogen-containing compound is mixed with an inert gas, the pressure is preferably around normal pressure such as 1500 to 500 mbar, more preferably 1200 to 800 mbar. When the (semi)metal-containing compound or the nitrogen-containing compound is not mixed with an inert gas the pressure depends on the vapor pressure of the (semi)metal-containing compound or the nitrogen-containing compound. Often the pressure is then from 100 to $10^{-3}$ mbar, more preferably from 10 to 0.1 mbar. In this case it is preferable to run the process in an apparatus in which the pressure can be adjusted such as in a vacuum chamber.

Preferably, the process according to the present invention is performed by passing the (semi)metal-containing compound and the nitrogen-containing compound in the gaseous state through separate orifices which are moved relative to the substrate. This means that either the substrate is moved and the orifices are kept immobile or the substrate is kept immobile while the orifices are moved or both the substrate and the orifices are moved. Preferably the speed of motion is from 0.01 to 10 m/s, more preferably 0.02 to 1 m/s, in particular 0.05 to 0.3 m/s. The orifices are arranged such that the (semi)metal-containing compound and nitrogen-containing compound hit the surface of the substrate in the order as described for the process above. Decomposition of the (semi)metal-containing compound is preferably effected by an orifice through which a decomposition material, such as water, is passed towards the surface of the substrate. In order to avoid reactions in the gas phase it is preferred to place orifices through which an inert gas, such as nitrogen or argon, are passed towards the surface of the substrate.

When performing the process by passing the (semi)metal-containing compound and the nitrogen-containing compound through separate orifices the pressure at the substrate is preferably 100 to 5000 mbar, more preferably 500 to 1500 mbar, in particular 800 to 1200 mbar, such as atmospheric pressure. Alternatively, however, it is possible to use lower pressures as described above if the apparatus can be evacuated.

Preferably the orifices are mounted on a rotating drum around which the substrate is placed, preferably moved. Such an apparatus is described in WO 2011/099 858 A1. In case the substrate is flexible an organic-inorganic substrate can thus be deposited on a large substrate in a so-called roll-to-roll process.

In the process according to the present invention the sequence comprising (a) and (b) is performed at least twice, preferably at least three times, more preferably at least five times, even more preferably at least 10 times, in particular at least 30 times, such as at least 50 times or at least 100 times. Usually, this sequence is performed not more than 1000 times. The organic and inorganic layers can be made independent of each other by the same number of ALD cycles or by different ones. For example, one inorganic layer can be made by 4 ALD cycles while a different one can be made by 8 ALD cycles. Preferably, all inorganic layers are made with the same number of ALD cycles. More preferably, all inorganic layers are made with the same number of ALD cycles and all organic layers are made by one ALD cycle.

Furthermore it is possible that different compounds are used for producing different inorganic layers or for different organic layers. Preferably, all organic layers are produced with the same organic compounds. Preferably, all inorganic layers are produced with the same (semi)metal-containing compound.

The process according to the present invention yields laminates with low permeability for small molecules like water and oxygen and with high flexibility. Therefore, the present invention also relates to such laminates. A good measure for the permeability for small molecules is the water vapor transmission rate (WVTR). It is preferably measured by evaporating an array of calcium dots onto the laminates and depositing another laminate on top of the calcium dots. These samples are then exposed to warm humid air, for example at 30 to 100° C. at 30 to 90% relative humidity, preferably at 60 to 85° C. at 70 to 90% relative humidity, for example at 60° C. and 90% relative humidity or 85° C. and 85% relative humidity. This exposure usually takes at least 100 hours, preferably at least 200 hours, in particular at least 300 hours. Normally, the exposure does not take more than 1000 hours. The number of calcium dots which have turned transparent is used to calculate the WVTR as described by Paetzold et al. (Review of Scientific Instruments 74 (2003) 5147-5150). Generally, a laminate is regarded as having a low permeability for small molecules if the WVTR is smaller than $10^{-2}$ g/m$^2$ d, preferably $10^{-4}$ g/m$^2$ d, more preferably $10^{-5}$ g/m$^2$ d, in particular $10^{-6}$ g/m$^2$ d.

A suitable method of measuring the flexibility of the laminate is to bend the laminate containing calcium dots and a second laminate on top as described above several times, for example 100 times, around a cylindrically shaped object with a radius of 0.1 to 10 cm, preferably 0.1 to 2 cm and measure the WVTR rate afterwards as described above. The laminate is regarded as having high flexibility if the WVTR is not more than 1000 times higher in comparison to the respective laminate before bending, preferably not more than 100 times higher, in particular not more than 10 times higher.

According to the present invention the inorganic layer has a thickness 0.3 to 15 nm. Preferably the inorganic layer has a thickness of at least 0.4 nm, more preferably at least 0.5 nm, in particular at least 0.6 nm. Preferably the inorganic layer has a thickness of not more than 9 nm, more preferably not more than 5 nm, in particular not more than 4 nm, such as not more than 3 nm or not more than 2 nm. The nitrogen-comprising organic layer preferably has a thickness of 0.1 to 3 nm, more preferably of 0.2 to 2 nm, in particular 0.3 to 1.5 nm, such as 0.4 to 1 nm. The thickness of the layers is typically measured by X-ray diffraction such as wide-angle X-ray diffraction (WAXD), preferably with a synchrotron as X-ray source.

The inorganic layer can be chosen from a wide variety of compounds. These include inorganic oxides, inorganic nitrides, inorganic carbides, perovskites, garnets, pyrochlors, transparent conductors and II-VI compounds. Inorganic oxides are preferred.

Examples for inorganic oxides including earth alkaline metal oxides such as BeO, MgO, CaO, SrO, BaO; main group metal oxides such as $Al_2O_3$, $SiO_2$, $Ga_2O_3$, $GeO_2$, $In_2O_3$, $SnO_2$, $Tl_2O$, PbO, $PbO_2$, $Bi_2O_3$; transition metal oxides such as $Sc_2O_3$, $TiO_2$, $V_2O_5$, $CrO_2$, MnO, $Mn_2O_3$, FeO, $Fe_3O_4$, $Fe_2O_3$, CoO, $Co_2O_3$, NiO, $Ni_2O_3$, $Cu_2O$, CuO, ZnO, $Y_2O_3$, $ZrO_2$, $Nb_2O_5$, MoO, $MoO_2$, Tc, $RuO_2$, $Rh_2O$, PdO, $Ag_2O$, CdO, $HfO_2$, $Ta_2O_5$, $WO_3$, $ReO_3$, $OsO_4$, $IrO_2$, $PtO_2$, AuO, $Hg_2O$; lanthanoid oxides such as $La_2O_3$, $Ce_2O_3$, $CeO_2$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$. Preferred are $B_2O_3$, $Al_2O_3$, $SiO_2$, $La_2O_3$, $Y_2O_3$, ZnO, $ZrO_2$, in particular $Al_2O_3$. Often, oxides in thin layers according to the present invention are hydrated to some extent. These hydrates nevertheless count as oxides represented by a formula above in the context of the present invention. Alternatively, the oxide $Al_2O_3$, for example, can be represented by the more general formula $AlO_x(OH)_y$, wherein $0 \leq x \leq 1.5$; $0 \leq y \leq 3$ and $2x+y=3$, preferably $1 \leq x \leq 1.5$; $0 \leq y \leq 1$ and $2x+y=3$.

Examples for inorganic nitrides include BN, AlN, $Si_3N_4$, $Ti_3N_4$, TaN, NbN, WN, MoN, GaN, $Zr_3N_4$, InN, and $Hf_3N_4$, preferably BN, AlN, $Si_3N_4$, $Ti_3N_4$, $Zr_3N_4$. Examples for inorganic carbides include $B_4C_3$, SiC, ZrC. Examples for perovskites include $BaTiO_3$, $SrTiO_3$, $LaNiO_3$, and $LaCoO_3$. Examples for garnets include $Fe_3Al_2(SiO_4)_3$, $Mg_3Al_2(SiO_4)_3$, and $Mn_3Al_2(SiO_4)_3$. Examples for pyrochlores include $La_2Zr_2O_7$, $Gd_{1.9}Ca_{0.1}Ti_2O_{6.9}$, $Dy_2Ti_2O_7$, and $Y_2Mo_2O_7$. Examples for transparent conductors include Sn-doped $In_2O_3$, Sb-doped $SnO_2$, F-doped $SnO_2$, Al-doped ZnO. Examples for II-VI compounds are ZnS, ZnSe, ZnTe, CaS, SrS, BaS, CdS, CdTe, CdSe. Furthermore, mixed oxides and/or nitrides are possible such as AlON, SiAlON.

According to the present invention the laminate comprises at least twice a layer sequence comprising an inorganic and a nitrogen-comprising layer, preferably the laminate comprises the sequence at least three times, more preferably at least five times, even more preferably at least ten times, in particular at least 30 times, such as at least 50 times or at least 100 times. Usually the laminate comprises the sequence not more than 1000 times.

Preferably the organic layer contains nitrogen in the oxidation state −3. The oxidation state of nitrogen in a laminate according to the present invention can be determined by the characteristic bands in an infrared (IR) spectrum of the laminate.

The laminate according to the present invention is particularly useful for producing barrier films. Therefore the present invention further relates to a barrier film comprising the laminate according to the present invention.

The barrier film according to the present invention typically further comprises a substrate. The substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Polymers are preferred. Polymers include polyesters such as polyethylene terephthalate (PET) or polyethylene naphthalene-dicarboxylic acid (PEN); polyimides; polyacrylates such as poly methyl methacrylate (PMMA); polyacrylamides; polycarbonates such as poly(bispheno) A carbonate); polyvinylalcohol and its derivatives like polyvinyl acetate or polyvinyl butyral; polyvinylchloride; polyolefins such as polyethylene (PE) or polypropylene (PP); polycycloolefins such as polynorbornene; polyethersulphone; polyamides like polycaprolactam or poly(hexamethylene adipic amide); cellulose derivatives such as hydroxyethyl cellulose, hydroxypropyl cellulose, methyl cellulose, methyl hydroxylpropyl cellulose or nitrocellulose; polyurethanes; epoxy resins; melamine formaldehyde resins; phenol formaldehyde resins. Polymers include copolymers such as poly(ethylene-co-norbornene) or poly(ethylene-co-vinylacetate). Polyesters and polycycloolefins are preferred.

The substrate can have any size and shape. Preferably the substrate is a film. The thickness of the substrate film depends on the application. If the barrier film is bent around a radius of more than 10 mm, the substrate film preferably has a thickness of 100 to 1000 μm, more preferably 100 to 500 μm, for example 100 to 200 μm. If the barrier film is bent with a radius of less than 10 mm the substrate film preferably has a thickness of 1 to 100 μm, more preferably 10 to 70 μm, such as 40 to 60 μm.

The surface of the substrate is preferably of high planarity. High planarity in the context of the present invention means that the highest point on the surface is not more than 100 nm higher than the lowest point on the surface, preferably not more than 50 nm. The planarity can be measured with atomic force microscopy, preferably in tapping mode.

Substrates are often not available with high planarity, e.g. due to small scratches, or particles such as dust adhered to their surface. It is therefore preferred that the barrier film further comprises a planarization layer to avoid damaging such as puncturing the laminate. More preferably the planarization layer is in between the substrate and the laminate. In this case the planarization layer can additionally serve to better hold together the substrate and the laminate, particularly upon bending or heating. Planarization layers can comprise organic polymers such as acrylates or epoxy, ceramics such as carbides, e.g. SiC, or organic-inorganic hybrid materials such as polyalkylsiloxanes. Organic polymers are preferred.

Often the planarization layer is made by depositing the material making up the planarization layer on the substrate before applying the laminate. In the case of organic polymers a liquid comprising a monomer is cast on the substrate and then cured, for example by heating or by UV initiation.

UV initiation is preferred, more preferably the liquid comprising the monomer further comprises a curing aid such as a functionalized benzophenone. Preferably the liquid comprising the monomer comprises a mixture of mono- and difunctional monomers such that cross-linked organic polymers are obtained after curing. Planarization layers comprising ceramics are usually obtained by sputtering the material onto the substrate. Planarization layers comprising organic-inorganic hybrid materials can be obtained by casting a solution comprising an organic-inorganic precursor on the substrate, evaporating the solvent and condensing the organic-inorganic precursor, for example by heating. This process is often referred to as sol-gel process. An example for an organic-inorganic precursor is alkyl-trialkoxysilane. Preferably the precursor is functionalized with a UV curable side group, for example acrylate. In this way the organic-inorganic hybrid material can be cross-linked.

Preferably the material making up the planarization layer has a modulus of elasticity in between that of the substrate material and that of the laminate, for example 10 to 30 GPa. The method of determining the modulus of elasticity is described in ISO 527-1 (Plastics—Determination of tensile properties, 2012).

Preferably the barrier film according to the present invention further comprises a protective layer to avoid mechanical damaging of the laminate, e.g. by scratching. The protective layer can for example comprise an epoxy resin. It is further possible that the protective layer is an adhesive which e.g. connects the laminate to an electronic device. It has surprisingly been found out that a combination of the barrier film according to the present invention with a protective layer shows a synergistic effect with regard to the WVTR, i.e. the WVTR is lower than one would expect when combining the barrier film and the protective layer.

Preferably the barrier film according to the present invention further comprises a getter material. This getter material binds small molecules like water or oxygen and thus decreases the permeability of the barrier film even further. Examples for getter materials are highly reactive metals such as Ca or strongly water-absorbing oxides such as CaO or $SiO_2$.

The present invention further relates to the use of the barrier film according to the present invention for encapsulation, packaging or passivation. Any good which is sensitive to small molecules like water or oxygen can be encapsulated, packed or passivated with the barrier films according to the present invention such as food, medicaments, reactive chemicals, batteries, or preferably electronic devices. Examples for electronic devices are field-effect transistors (FET), solar cells, light emitting diodes, sensors, or capacitors, in particular if the active materials in the electronic devices are organic molecules. The barrier film according to the invention can in addition be used as electric insulator, for example as dielectric in a transistor.

With the process according to the present invention laminates are accessible which have a high barrier against the diffusion of small molecules. These laminates maintain their high diffusion barrier upon bending. When using flexible substrates, flexible barrier films are accessible with high diffusion barriers.

EXAMPLES

Example 1 (Inventive)

A barrier film was made using a PET substrate. The PET substrate had a size of 2.5×2.5 $cm^2$, a thickness of 100 µm, and a density of 1.4 $g/cm^3$. The PET substrate was cleaned by rinsing with deionized water, acetone and ethanol followed by a 30 min O2 plasma treatment with a plasma power of 100 W. Afterwards the PET substrate was degassed within a vacuum chamber for 30 min until the pressure reached 5~$10^{-5}$ mbar. The vacuum chamber including the PET substrate was heated to 80° C. Trimethylaluminum (TMA) in the gaseous state was introduced into the vacuum chamber by opening a valve to a side chamber containing TMA in liquid form for 2 s, then the vacuum chamber was evacuated again to reach 5~$10^{-5}$ mbar for 15 s.

After this, water in the gaseous state was introduced into the vacuum chamber for 2 s after which the vacuum chamber was again evacuated for 38 s. This sequence was performed eight times. Then TMA was introduced into the vacuum chamber as describe above for 2 s, the vacuum chamber was evacuated for 15 s whereupon 4-aminophenol (4AP) was introduced into the vacuum chamber by opening a valve to a chamber containing liquid 4AP at 120° C. for 8 s after which the vacuum chamber was evacuated for 200 to 300 s.

Figure 1:
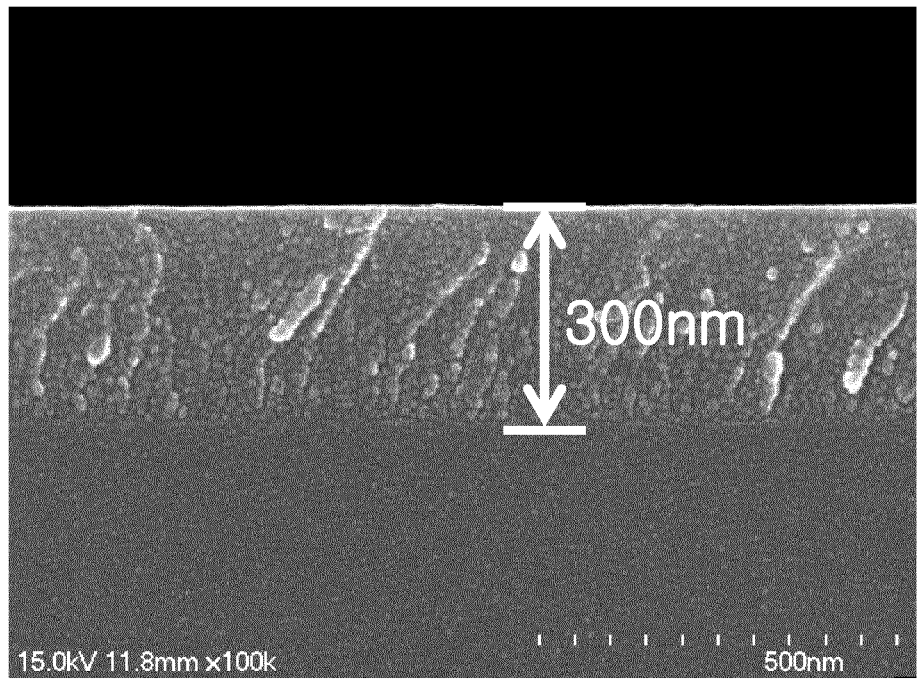
FIGS. 1 to 4 show scanning electron microscopy images of fractured samples of examples.

The above described sequence is denoted by [[TMA-$H_2O]_8$-TMA-4AP]. This sequence was consecutively performed 250 times. The same organic-inorganic laminate was prepared on a silicon wafer. This wafer was fractured and subject to scanning electron microscopy. The thus obtained image is depicted in FIG. 1. The thickness of the organic-inorganic laminate was estimated from the image to be 300 nm.

Example 2 (Inventive)

Figure 2:
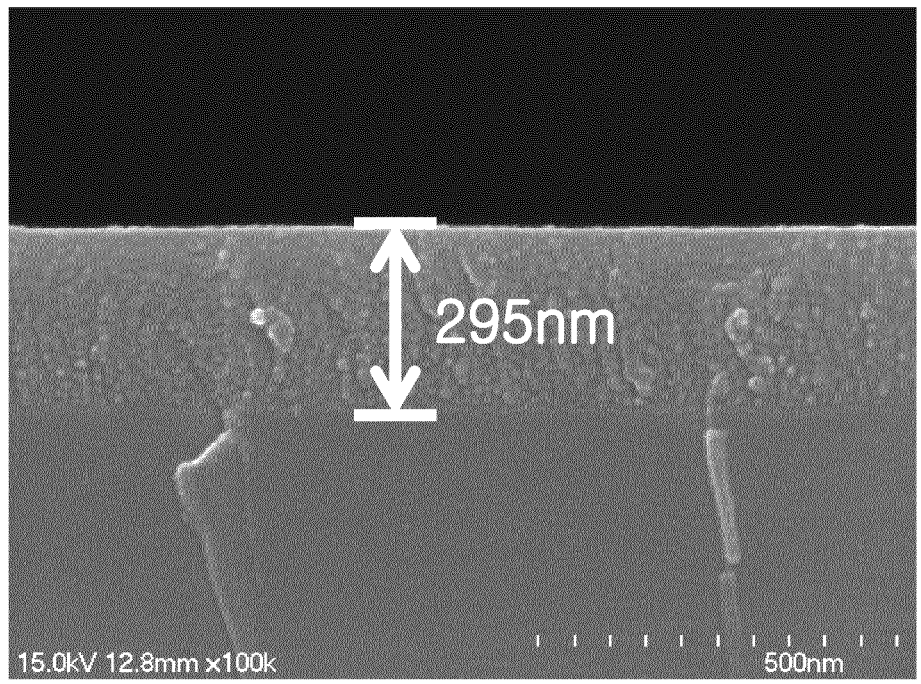

A barrier film was made as in example 1 wherein a sequence [[TMA-$H_2O]_{13}$-TMA-4AP] was consecutively performed 180 times. The same organic-inorganic laminate was prepared on a silicon wafer. This wafer was fractured and subject to scanning electron microscopy. The thus obtained image is depicted in FIG. 2. The thickness of the organic-inorganic laminate was estimated from the image to be 295 nm.

Example 3 (Inventive)

Figure 3:
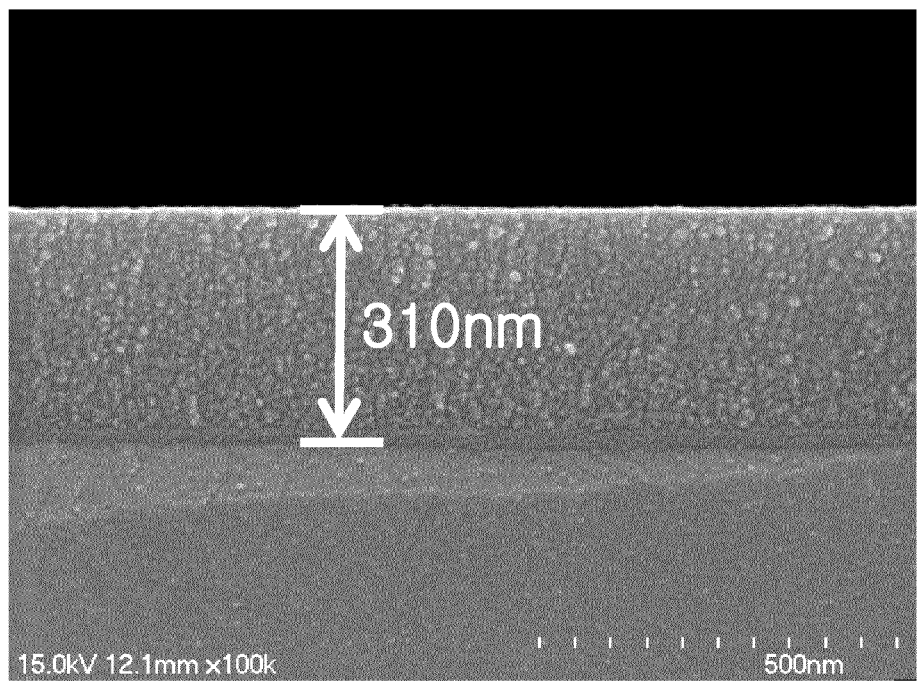

A barrier film was made as in example 1 wherein a sequence [[TMA-$H_2O]_{25}$-TMA-4AP] was consecutively performed 100 times. The same organic-inorganic laminate was prepared on a silicon wafer. This wafer was fractured and subject to scanning electron microscopy. The thus obtained image is depicted in FIG. 3. The thickness of the organic-inorganic laminate was estimated from the image to be 310 nm.

Example 4 (Comparative)

A barrier film was made by alternatingly exposing a PET substrate to TMA and $H_2O$ under the conditions described in example 1 for 500 times.

Example 5 (Comparative)

A barrier film was made by alternatingly exposing a PET substrate to TMA and $H_2O$ under the conditions described in example 1 for 250 times.

Example 6 (Inventive)

A barrier film was made as in example 1 wherein instead of 4AP 4-aminobenzylic alcohol (4ABA) is used which is kept at 120° C.

Example 7 (Inventive)

A barrier film was made as in example 2 wherein instead of 4AP 4ABA is used which is kept at 120° C.

Example 8 (Inventive)

Figure 4:
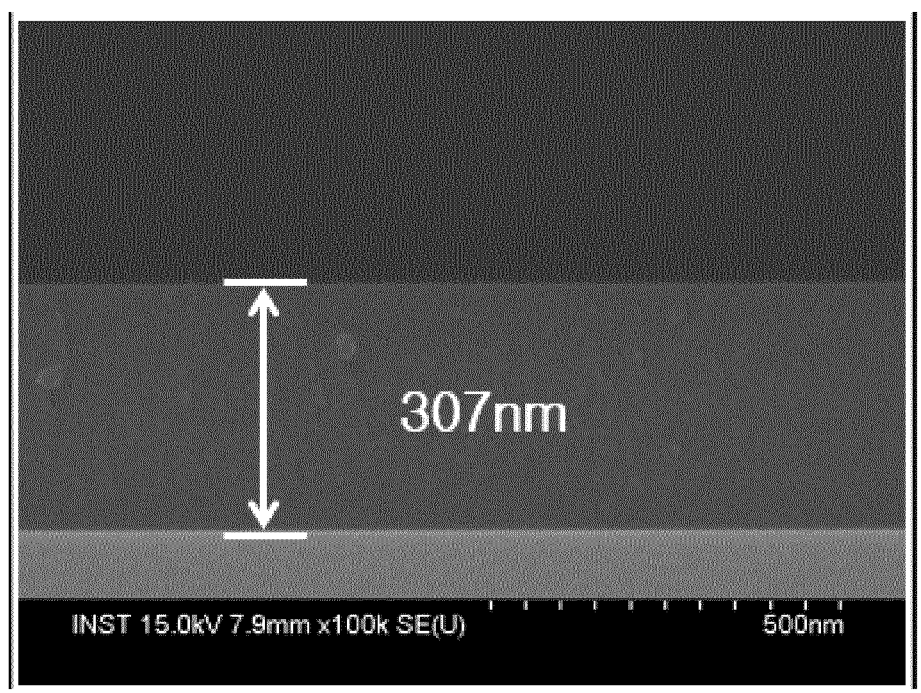

A barrier film was made as in example 3 wherein instead of 4AP 4-aminobenzylic alcohol (4ABA) was used which is kept at 120° C. The same organic-inorganic laminate was prepared on a silicon wafer. This wafer was fractured and subject to scanning electron microscopy. The thus obtained image is depicted in FIG. 4. The thickness of the organic-inorganic laminate was estimated from the image to be 307 nm.

Testing of the Barrier Films

The water vapor transmission rates (WVTR) of the barrier films prepared on PET substrates were tested by evaporating 144 dots of Ca with a thickness of 350 nm and a size of 10×10 μm$^2$ on each film at 1.3~10$^{-7}$ mbar. On top of the Ca dots another laminate was made as described in the respective examples. The films were then placed inside a drying cabinet with 70% relative humidity at 70° C. for 480 h. The WVTR was calculated by the number of Ca dots which became transparent after this storage procedure as described above.

The barrier film was bent 100 times at a bending radius of 0.5. Afterwards the WVTR was calculated as described above with the difference that the samples were stored for 360 h. The results are summarized in the following table.

| | WVTR in g/m$^2$d | |
|---|---|---|
| Example | before bending | After bending |
| 1 (inventive) | <1 · 10$^{-6}$ | 4 · 10$^{-6}$ |
| 2 (inventive) | <1 · 10$^{-6}$ | 8 · 10$^{-5}$ |
| 3 (inventive) | <1 · 10$^{-6}$ | |
| 4 (comparative) | 1 · 10$^{-6}$ | >0.1 |
| 5 (comparative) | 5 · 10$^{-5}$ | >0.1 |
| 6 (inventive) | 1 · 10$^{-6}$ | 8 · 10$^{-6}$ |
| 7 (inventive) | <1 · 10$^{-6}$ | 10$^{-3}$ |
| 8 (inventive) | <1 · 10$^{-6}$ | |

The invention claimed is:

1. A laminate comprising at least twice a layer sequence comprising:
    (a) an inorganic layer having a thickness of 0.3 nm to 1.5 mm, wherein the inorganic layer comprises an alkyl (semi)metal-containing compound; and
    (b) a nitrogen-comprising organic layer having a thickness of 0.1 nm to 3 nm, wherein the nitrogen-comprising organic layer is formed from a nitrogen-containing compound comprising: (i) an aromatic compound selected from the group consisting of benzene, naphthalene, and biphenyl; and (ii) one or two amine functional groups and a hydroxyl functional group.

2. The laminate according to claim 1 wherein the organic layer contains nitrogen in the oxidation state-3.

3. The laminate according to claim 1 wherein the inorganic layer comprises AlO$_x$(OH)$_y$, wherein 0≤x≤1.5; 0≤y≤3 and 2x+y=3.

4. The laminate according to claim 1 wherein the laminate comprises the layer sequence comprising (a) and (b) at least 30 times.

5. A barrier film comprising the laminate according to claim 1.

6. The barrier film according to claim 5 wherein the barrier film further comprises a polymeric substrate.

7. The barrier film according to claim 5 wherein the barrier film further comprises a planarization layer.

8. The barrier film according to claim 5, wherein the barrier film is suitable for at least one of encapsulation, packaging, or passivation.

9. An electronic device comprising the barrier film according to claim 5.

10. A process for producing the laminate of claim 7, the process comprising at least twice a sequence comprising
    (a) depositing an inorganic layer by performing 3 to 150 cycles of an atomic layer deposition process, and
    (b) depositing an organic layer comprising nitrogen by performing 1 to 3 cycles of a molecular layer deposition process.

11. The process according to claim 10 wherein a primary amine is used in the molecular layer deposition process to deposit the organic layer.

12. The process according to claim 10 wherein an aromatic amine is used in the molecular layer deposition process to deposit the organic layer.

13. The process according to claim 10 wherein an aromatic amine containing a hydroxyl group is used in the molecular layer deposition process to deposit the organic layer.

14. The process according to claim 10 wherein an Al-containing compound is used in the atomic layer deposition process to deposit the inorganic layer.

15. The process according to claim 10 wherein the sequence comprising (a) and (b) is performed at least 30 times.

* * * * *